(12) United States Patent
Nowell et al.

(10) Patent No.: US 11,917,793 B2
(45) Date of Patent: Feb. 27, 2024

(54) LOCALIZED IMMERSION COOLING ENCLOSURE

(71) Applicant: CISCO TECHNOLOGY, INC., San Jose, CA (US)

(72) Inventors: Mark Nowell, Kanata (CA); M. Baris Dogruoz, Campbell, CA (US); Mandy Hin Lam, Fremont, CA (US); Rakesh Chopra, Menlo Park, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 56 days.

(21) Appl. No.: 17/145,816

(22) Filed: Jan. 11, 2021

(65) Prior Publication Data
US 2022/0225537 A1     Jul. 14, 2022

(51) Int. Cl.
H05K 7/20     (2006.01)
G06F 1/20     (2006.01)
H01L 23/44    (2006.01)

(52) U.S. Cl.
CPC ........... *H05K 7/20236* (2013.01); *G06F 1/20* (2013.01); *H01L 23/44* (2013.01)

(58) Field of Classification Search
CPC ..... H05K 7/20236; H05K 7/203; H01L 23/44
See application file for complete search history.

(56) References Cited

U.S. PATENT DOCUMENTS

| | | | | |
|---|---|---|---|---|
| 4,302,793 A * | 11/1981 | Rohner | ............. | H05K 7/20272 361/689 |
| 4,704,658 A * | 11/1987 | Yokouchi | ............. | H05K 7/203 361/698 |
| 8,107,256 B1 * | 1/2012 | Kondrat | ............. | H05K 7/1429 361/796 |
| 9,220,183 B1 * | 12/2015 | Buvid | ............. | H01L 25/0657 |
| 10,694,635 B1 * | 6/2020 | Rivnay | ............. | H05K 7/1445 |
| 10,750,637 B1 * | 8/2020 | Alissa | ............. | H05K 7/203 |
| 11,096,313 B2 * | 8/2021 | Amos | ............. | H05K 7/20772 |
| 2010/0290190 A1 * | 11/2010 | Chester | ............. | B65B 63/08 174/547 |
| 2011/0134604 A1 | 6/2011 | Attlesey | | |
| 2011/0315344 A1 | 12/2011 | Campbell | | |
| 2012/0327597 A1 * | 12/2012 | Liu | ............. | H05K 7/20736 361/692 |
| 2013/0105120 A1 | 5/2013 | Campbell | | |

(Continued)

FOREIGN PATENT DOCUMENTS

RU     2643173 C1     1/2018

OTHER PUBLICATIONS

Fangzhi, "Immersion Cooling for Green Computing," OCP Summit, Mar. 20-21, 2018, 23 pages.

(Continued)

*Primary Examiner* — Stephen S Sul

(57) ABSTRACT

In one embodiment, an apparatus is configured for insertion into a network device and includes a printed circuit board, at least one electronic component mounted on the printed circuit board and configured for direct air-cooling, and an enclosure comprising a plurality of electronic components, an electrical connector, a fluid inlet connector, and a fluid outlet connector. A dielectric liquid is disposed within the enclosure for immersion cooling of said plurality of electronic components during operation of the network device.

26 Claims, 14 Drawing Sheets

(56) References Cited

U.S. PATENT DOCUMENTS

| | | | |
|---|---|---|---|
| 2014/0085805 A1* | 3/2014 | Xu | H05K 7/1487 |
| | | | 361/679.33 |
| 2014/0085817 A1* | 3/2014 | Campbell | H05K 7/20772 |
| | | | 361/689 |
| 2014/0146468 A1 | 5/2014 | Campbell | |
| 2014/0340848 A1 | 11/2014 | Vos | |
| 2015/0062806 A1 | 3/2015 | Shelnutt | |
| 2015/0228569 A1* | 8/2015 | Wang | H01L 23/49866 |
| | | | 174/255 |
| 2016/0165742 A1* | 6/2016 | Shen | G06F 1/187 |
| | | | 361/679.37 |
| 2017/0208705 A1 | 7/2017 | Swenson | |
| 2017/0265328 A1* | 9/2017 | Sasaki | H05K 7/20781 |
| 2017/0265336 A1* | 9/2017 | Ichinose | H05K 7/20772 |
| 2019/0044855 A1* | 2/2019 | Buhlman | G06F 3/0631 |
| 2019/0045652 A1* | 2/2019 | Hirano | H05K 7/1492 |
| 2019/0098798 A1* | 3/2019 | Franz | H05K 7/20509 |
| 2019/0223324 A1* | 7/2019 | Le | H05K 7/20263 |
| 2020/0093031 A1 | 3/2020 | Chopra | |
| 2021/0221776 A1* | 7/2021 | Smith | C07C 211/40 |
| 2022/0210943 A1* | 6/2022 | Chang | H05K 7/1492 |

OTHER PUBLICATIONS

"Functional electronic packaging," IBM Research, retrieved from Internet Jun. 8, 2022, 8 pages; https://www.zurich.ibm.com/st/electronicpackaging/cooling.html.

Michael J. Ellsworth, Jr., "High Powered Chip Cooling—Air and Beyond," Electronics Cooling, Aug. 1, 2005, 16 pages; https://www.electronics-cooling.com/2005/08/high-powered-chip-cooling-air-and-beyond/.

Robert E. Simons, "Direct liquid immersion cooling for high power density microelectronics," Electronics Cooling, May 1, 1996, 14 pages; https://www.electronics-cooling.com/1996/05/direct-liquid-immersion-cooling-for-high-power-density-microelectronics/.

* cited by examiner

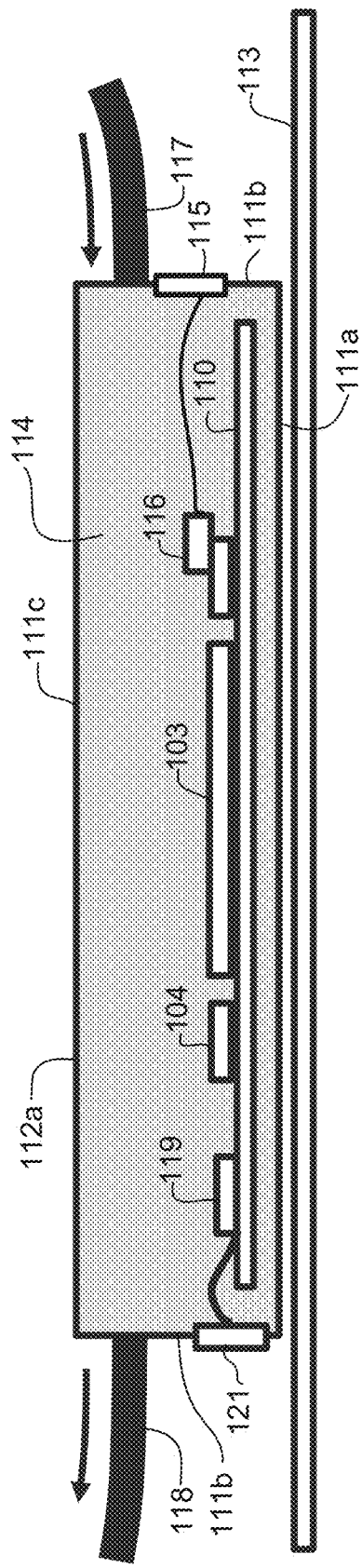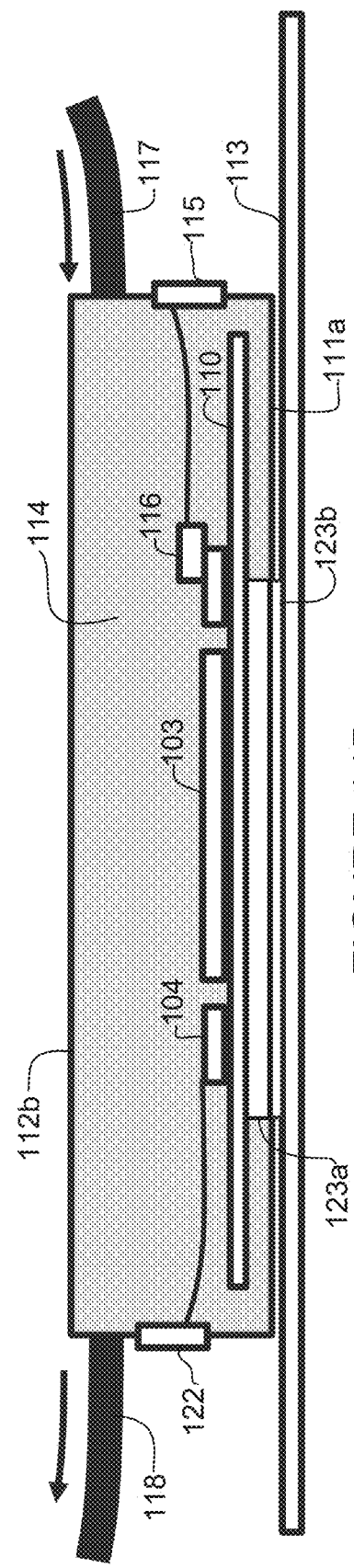
FIGURE 11A
FIGURE 11B

LOCALIZED IMMERSION COOLING ENCLOSURE

TECHNICAL FIELD

The present disclosure relates generally to cooling of electronic or optical components, and more particularly, to immersion cooling.

BACKGROUND

Over the past several years, there has been a tremendous increase in the need for higher performance communications networks. Increased performance requirements have led to an increase in energy use resulting in greater heat dissipation from components. As power use and density increases, traditional air cooling may no longer be adequate to cool network devices and liquid cooling may be needed. There are a number of drawbacks with conventional liquid cooling techniques.

BRIEF DESCRIPTION OF THE DRAWINGS

FIG. 11A is a side view of the immersion cooling enclosure with sidewall connections.

FIG. 11B is a side view of the immersion cooling enclosure with sidewall and PCB (Printed Circuit Board) connections.

Corresponding reference characters indicate corresponding parts throughout the several views of the drawings.

DESCRIPTION OF EXAMPLE EMBODIMENTS

Overview

Figure 1:
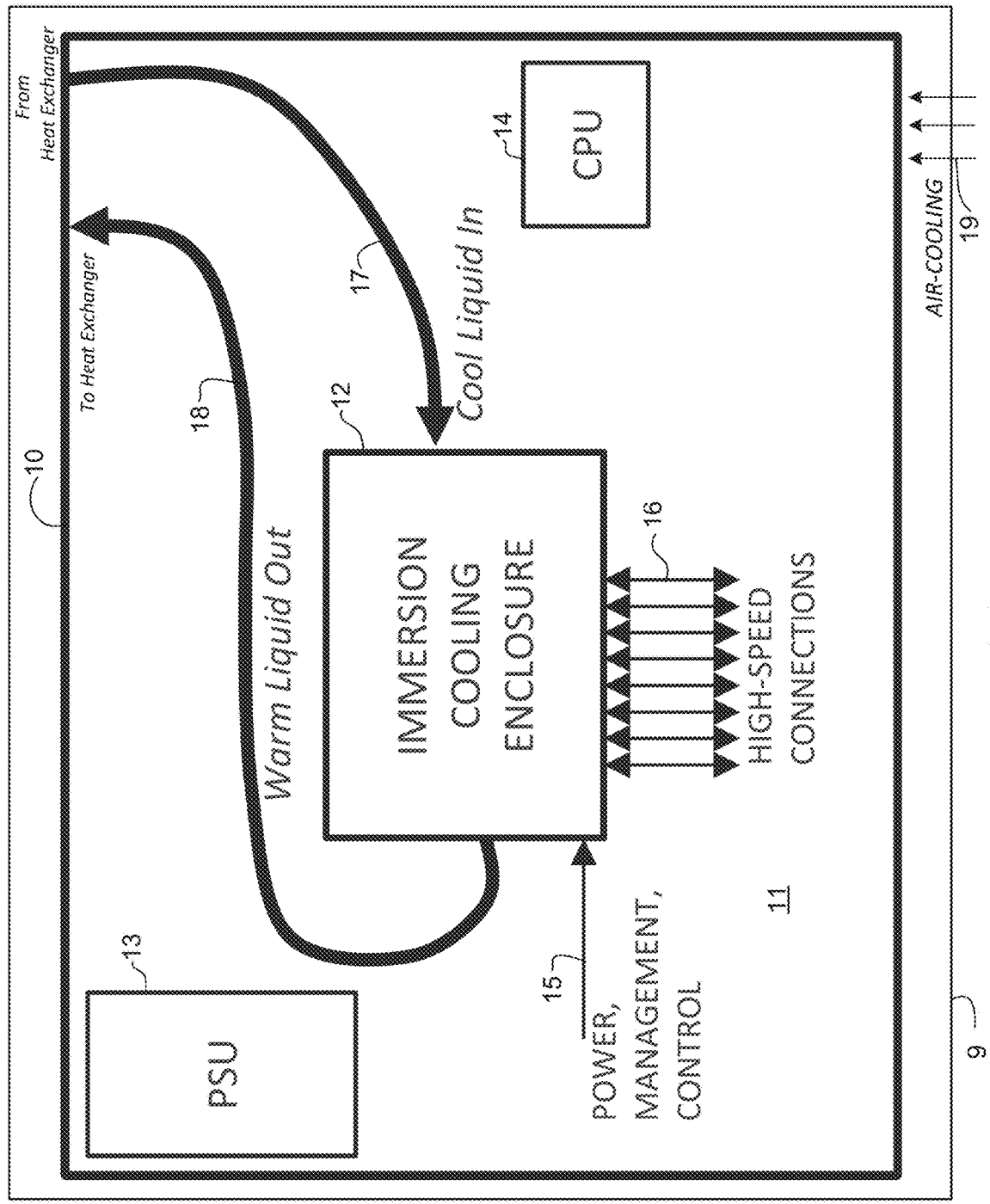
FIG. 1 schematically illustrates a line card with a localized immersion cooling enclosure, in accordance with one embodiment.

In one embodiment, an apparatus configured for insertion into a network device generally comprises a printed circuit board, at least one electronic component mounted on the printed circuit board and configured for direct air-cooling, and an enclosure comprising a plurality of electronic components, an electrical connector, a fluid inlet connector, and a fluid outlet connector. A dielectric liquid is disposed within the enclosure for immersion cooling of the electronic components in the enclosure during operation of the network device.

In another embodiment, an apparatus generally comprises a sealed enclosure for connection to a line card, a substrate within the enclosure, an electronic component mounted on the substrate, an optical component mounted on the substrate, an electrical connector for transmitting power or data to the electronic component within the enclosure, an optical connector for transmission of optical data to or from the optical component within the enclosure, a fluid inlet connector, and a fluid outlet connector. A dielectric liquid is disposed within the enclosure for immersion cooling of the electronic component and the optical component with the enclosure connected to the line card.

In another embodiment, a network device generally comprises a circuit board and a plurality of enclosures connected to the circuit board, each of the enclosures comprising a plurality of electronic components, an electrical connector, a fluid inlet connector, and a fluid outlet connector. A dielectric liquid is disposed within the enclosure for immersion cooling of the electronic components with the fluid inlet connector and the fluid outlet connector coupled to a liquid cooling circuit.

In yet another embodiment, an apparatus generally comprises a housing defining a sealed enclosure and comprising a first wall for mounting on a line card and external walls forming the housing with the first wall, a substrate disposed within the housing, an electronic component mounted on the substrate, an electrical connector for transmitting power or data to the electronic component within the enclosure, wherein the electrical connector is positioned on one of the external walls, a fluid inlet connector, and a fluid outlet connector. The sealed enclosure is configured for immersion cooling of the electronic component.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Cooling of high-power or high-density electronic or optical components is increasingly becoming a critical limitation in many network systems. Many cooling techniques are known with varying efficiencies and design or operation complexities. These range from traditional air-cooling designs, to a more complex cold-plate approach utilizing indirect liquid cooling to remove heat from a cooling element, and to the highly efficient but operationally challenging immersion cooling wherein an entire piece of equipment (e.g., chassis) is submerged into a non-conductive liquid.

The embodiments described herein provide a localized immersion cooling enclosure that takes advantage of highly efficient immersion cooling to solve challenging thermal issues while addressing design and operational challenges of conventional systems. The localized design allows for immersion cooling of only selected components, with air-cooling utilized for other components. As described below, the immersion cooling enclosure provides a significant amount of flexibility for implementation on various line card designs (e.g., modular line card or fixed platform). In the examples described herein, the line card may refer to a removable design for a modular chassis system or a fixed design within an enclosure (e.g., 1 to 4 RU (Rack Unit) height). Immersion cooling techniques are leveraged to address localized critical thermal hot-spot components. For example, the localized immersion cooling enclosure may include all of the high-power components on a line card or a subset of components while allowing air-cooling to be used for remaining components. The immersion cooling enclosure may include any combination of electrical or optical components and connectors for providing electrical power, electrical data (low-speed data (e.g., management, control), high-speed data), or optical data to the components along with fluid connectors for providing a flow of fluid through the enclosure. The fluid carries heat from the components out of the immersion cooling enclosure to provide localized immersion cooling to the heat generating components. Localized immersion cooling of electronic or optical components provides improved energy efficiency and higher performance cooling as compared to indirect liquid cooling or improved implementation or operational aspects as compared to full immersion cooling of a line card.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. One or more of the network devices may comprise one or more line cards comprising one or more immersion cooling enclosures described herein. One or more of the network devices may comprise a fixed platform comprising one or more immersion cooling enclosures described herein. The network device may include one or more processor, memory, and network interfaces, with one or more of these components located on the line card, which is removably inserted into the network device, or within the fixed platform. A network device may include any number of slots for receiving any number or type of line cards, including, for example, fabric cards, service cards, combo cards, controller cards, processor cards, high density line cards, high power line cards, or high density and power line cards, arranged in any format (e.g., positioned horizontally or vertically). A network device may also comprise an internal expansion module in a configurable fixed platform.

In one or more embodiments, each immersion cooling enclosure may contain a plurality of high-power components immersed in a liquid supplied via a fluid circuit that enables removal of heat. Since the liquid is in direct contact with active electronic components, the liquid comprises a dielectric coolant. In one or more embodiments, the cooling system comprises a low-pressure, low-speed immersion based coolant system utilizing electrically non-conductive (dielectric) liquid. The dielectric liquid may comprise any suitable dielectric coolant, including for example, R1234ze (Z), HFE-7100, FC-XX, or any other suitable dielectric fluid. The fluid may flow through one or more closed loop cooling circuits.

The coolant may be provided by a source of low-temperature supply coolant that is sent through distribution plumbing coupled to liquid cooling lines, and routed through immersion cooling enclosures inside the network device, as described below. Warmed coolant may be aggregated through a return manifold where it passes through a heat exchanger to remove the heat from the coolant loop to an external cooling plant, with the cycle then repeating. The heat exchanger may be a liquid-liquid heat exchanger or a liquid-air heat exchanger, with fans provided to expel the waste heat to the atmosphere, for example. The heat exchanger may be located within the network device, adjacent to the network device, or remote from the network device at a central location that services any number of network devices. For example, the heat exchanger may be located within the same rack as the network device or the system may be connected to a building wide liquid cooling distribution system.

The size of the fluid distribution lines may be determined based on the number of components to be cooled and the thermal capacity of the components. For example, different capacity coolant distribution lines may be used based on the number of components to be cooled using immersion cooling. Flow network modeling may be performed to take into account coolant system components and number of components within each immersion cooling enclosure. The heat exchanger may be sized to adequately remove heat produced by the components via the coolant distribution system.

Pumps for coolant distribution may be located external to the network device or within the modular electronic system. Additional pumps may also be located as needed within the coolant loop. In one or more embodiments, various sensors may monitor aggregate and individual branch coolant temperatures, pressures, flow rate quantities, or any combination thereof, at strategic points around the loop to identify loss of coolant or cooling. As noted above, the coolant system may comprise a low-pressure circuit and the pumps may be designed for low (or ultra-low) pumping power (e.g., lower power than used for air-cooling).

Referring now to the drawings, and first to FIG. 1, a line card (module) 10 with an immersion cooling enclosure (ICE) 12 is shown, in accordance with one embodiment. In the simplified schematic shown in FIG. 1, the line card 10 includes a power supply unit (PSU) 13 and a central processing unit (CPU) 14 mounted directly on a printed circuit board (PCB) 11. The term "printed circuit board" as used herein may refer to any suitable substrate (laminate, polymer, ceramic) or electronics board for mounting of components (e.g., electrical components, optical components) on the line card. The term "line card" as used herein may refer to any card configured for insertion into the network device (e.g., fabric card, controller card, network card, daughter card, and the like). The line card 10 may include any number or type of components in any arrangement. Also, it should be noted that while the example described with respect to FIG. 1 refers to an immersion cooling enclosure mounted on the PCB of a line card; the immersion cooling enclosure described herein may also be mounted on the PCB of a fixed platform design. Thus, the element 10 in FIG. 1 may be a removable line card or a structure (e.g., internal expansion module or other structure) in a fixed platform.

Figure 2:
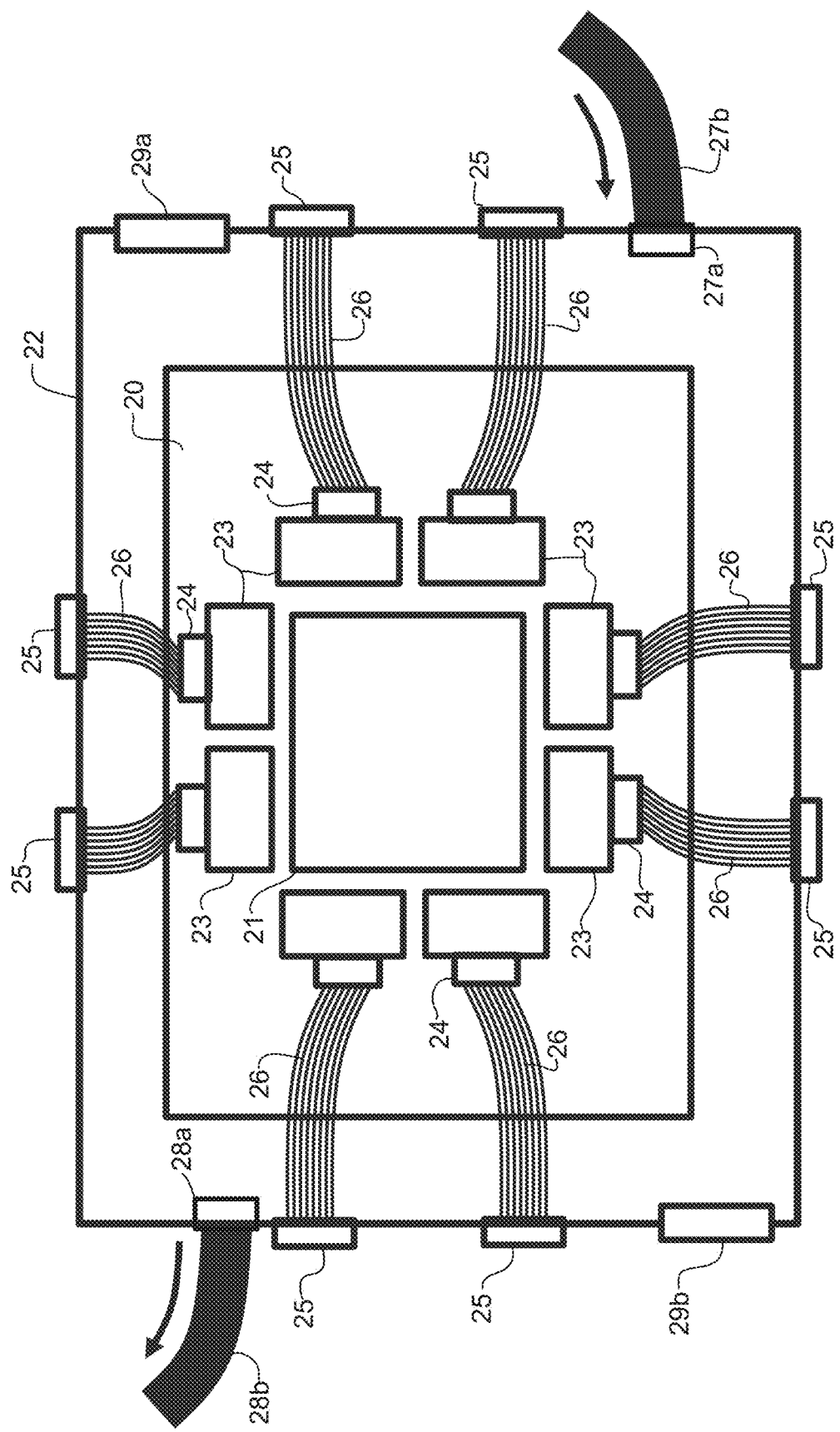
FIG. 2 illustrates an example of components within the immersion cooling enclosure.

In one or more embodiments, an apparatus (line card 10) configured for insertion into a network device 9 (e.g., slot of a chassis configured for receiving one or more line cards) comprises the printed circuit board 11, at least one electronic component (e.g., CPU 14) mounted on the PCB and configured for direct air-cooling (e.g., from fan providing air flow over the line card) as indicated at 19, and the enclosure 12 comprising a plurality of electronic components, an electrical connector, a fluid inlet connector, and a fluid outlet connector (described below with respect to FIG. 2). The fan (not shown) may be positioned on the line card 10 or another location within the network device for providing air-flow over the components not contained within the immersion cooling enclosure 12. Components mounted directly on the printed circuit board 11 may be, for example, lower power components that do not need the extra cooling provided by the immersion cooling enclosure 12. A dielectric liquid is disposed within the enclosure 12 for immersion cooling of the electronic components during operation of the network device.

The localized immersion cooling enclosure 12 contains one or more heat generating components (electrical component, optical component) immersed in the dielectric liquid supplied via a liquid circuit that enables removal of heat. The immersion cooling enclosure 12 is positioned (mounted, disposed) on the line card 10 and comprises a plurality of interfaces (e.g., electrical, optical, fluid). In the example shown in FIG. 1, the immersion cooling enclosure 12 comprises an electrical interface for receiving power or data (e.g., management data, control data), or both power and data on line 15. As shown in the example of FIG. 1, the immersion cooling enclosure 12 may also include a high-speed data interface for receiving or transmitting high-speed data 16. The high-speed interconnects may be optical, or electrical via PCB traces or high-speed cables (e.g., twinax (twinaxial) cables). A cool dielectric fluid is supplied to the enclosure at the fluid inlet line 17 and a warm dielectric fluid exits the enclosure at the fluid outlet 18 in a low-pressure circuit. The dielectric liquid immerses and surrounds all of the internal components (electrical, optical, electrical and optical) to provide a highly efficient thermal path as heat energy is absorbed into the liquid.

As described in detail below, the line card 10 may include any number of immersion cooling enclosures 12 comprising any number or type of connections and any number or type of heat generating components (e.g., high-power components, electrical components, optical components) may be located within the immersion cooling enclosure. Each immersion cooling enclosure on the line card comprises at least one dedicated thermal path transporting heat from a group of components segregated from another group of components on a line card, which may be air-cooled or contained in a separate immersion cooling enclosure, to a dielectric fluid in motion. The electrical (power, data) line 15 may be coupled to a component on the line card (e.g., PSU 13, CPU 14) or receive power or data from another source in the network device (e.g., cable connected to line card). The high-speed connections 16 may receive data from other components on the line card (e.g., pluggable optical modules) or cables connected to the line card, for example. The fluid lines 17 and 18 may be coupled to a fluid circuit (e.g., low-pressure dielectric cooling circuit) coupled to a heat exchanger. Components of the liquid cooling circuit (e.g., temperature monitors, pumps, heat exchangers) may be located on the line card or external to the line card (e.g., another line card or external to network device).

The immersion cooling enclosure 12 may contain (surround, enclose) any number of electronic components (e.g., ASIC (Application Specific Integrated Circuit) or other integrated circuit, chip, die, processor, memory, or high heat density electronic component), optical components (e.g., optical chip, optical engine, laser, light source), or other heat generating component in which heat dissipation capability of the component is insufficient to moderate its temperature. In one or more embodiments, the immersion cooling enclosure 12 comprises a heterogeneous structure comprising one or more die, memory device (e.g., on-substrate memory, high-bandwidth memory), SerDes (Serial/Deserializer), or on board optics/optical engine with or without a lid, located within the enclosure comprising the dielectric liquid. In one example, the heterogenous components are integrated in a single package on the same substrate (system-in-package), which is contained within the immersion cooling enclosure. Other examples of immersion cooling enclosure layouts on a line card are shown in FIGS. 3-9 and described below.

FIG. 2 illustrates an example of an immersion cooling enclosure 22 with electronic and optical components (e.g., ASIC and co-packaged optics). A top of the immersion cooling enclosure 22 is removed in FIG. 2 to show details internal to the enclosure. In one or more embodiments, an apparatus comprises the enclosure 22 for mounting on a line card (e.g., line card 10 in FIG. 1), a substrate 20 within the enclosure, an electronic component 21 mounted on the substrate, an optical component 23 mounted on the substrate (e.g., either directly or indirectly), an electrical connector 29*a*, 29*b* for transmitting power or data (e.g., power and low-speed electrical data (control, management), high-speed electrical data) to the electronic component 21 within the enclosure, an optical connector 25 (e.g., dense optical connector) for transmission of optical data to or from the optical component 23 within the enclosure, a fluid inlet connector 27*a*, and a fluid outlet connector 28*a*. The dielectric liquid is disposed within the enclosure 22 for immersion cooling of the electronic component 21 and the optical component 23 with the enclosure mounted on the line card. Cool fluid enters the enclosure 22 at ingress line 27*b*, passes over the internal components, and warm fluid exits at egress line 28*b*.

In the example shown in FIG. 2, the immersion cooling enclosure 22 contains an electronic integrated circuit (ASIC, NPU (Network Processing Unit)) 21 and photonic integrated circuits 23 (photonic chip, silicon photonics, optics technology) mounted on the substrate 20. In this example, the NPU 21 is surrounded by eight silicon photonic chips 23. As described below, the immersion cooling enclosure 22 may contain any number, type, or arrangement of electronic components, optical components, or both electronic and optical components. An FAU (Fiber Array Unit) 24 connects the photonic chip 23 to the optical connector 25 through any number of optical fibers 26. The optical connector 25 may comprise, for example, a plurality of optical fibers passing through a wall of the enclosure 22. In one example, the NPU 21 may receive power from power connector 29*a* and management and control data from data connector 29*b*. The connectors 29*a*, 29*b* may be coupled to the NPU 21 through the substrate 20, for example. Other examples of component layouts within the immersion cooling enclosure are shown in FIGS. 10-12B and described below.

It is to be understood that the line card 10 shown in FIG. 1 and components within the immersion cooling enclosure 22 shown in FIG. 2 are only examples and the immersion cooling enclosure described herein may be used in other arrangements (e.g., in combination with one or more other immersion cooling enclosures) or with any number of type of heat generating components contained within the enclosure and any number or type of external connections. Also, while the example of FIG. 1 describes an immersion cooling enclosure mounted on the PCB of a line card, it should be noted that the PCB may be mounted within a fixed platform design. As previously noted, the localized immersion cooling enclosure enables all or only a portion of the thermal challenges to be addressed using immersion cooling technology. Based on product needs, different components may be included within the immersion cooling enclosure or cooled by other means (e.g., air-cooled by fans).

The components within the immersion cooling enclosure may be referred to as a system-in-package. For example, in one or more embodiments, an NPU and embedded/co-packaged optics may be contained within the enclosure with a fixed optical interface configuration at the time of manufacturing. In one or more embodiments, the NPU may be integrated into the immersion cooling enclosure with no optics within the enclosure and air-cooled pluggable optical modules on the line card. In this example, the high-power NPU may be cooled within the immersion cooling enclosure without the need to liquid cool optical components, thereby providing user flexibility of optics. In one or more embodiments, an NPU and embedded/co-packaged optics may be integrated into the immersion cooling enclosure and air-cooled pluggable optical modules may be located on the line card. This example provides flexibility as to the portion of optical ports that may be pluggable and enables a solution for a line card mix of coherent or user pluggable modules and embedded user interfaces. Examples of the above-described systems are shown in FIGS. 3-9.

Figure 3:
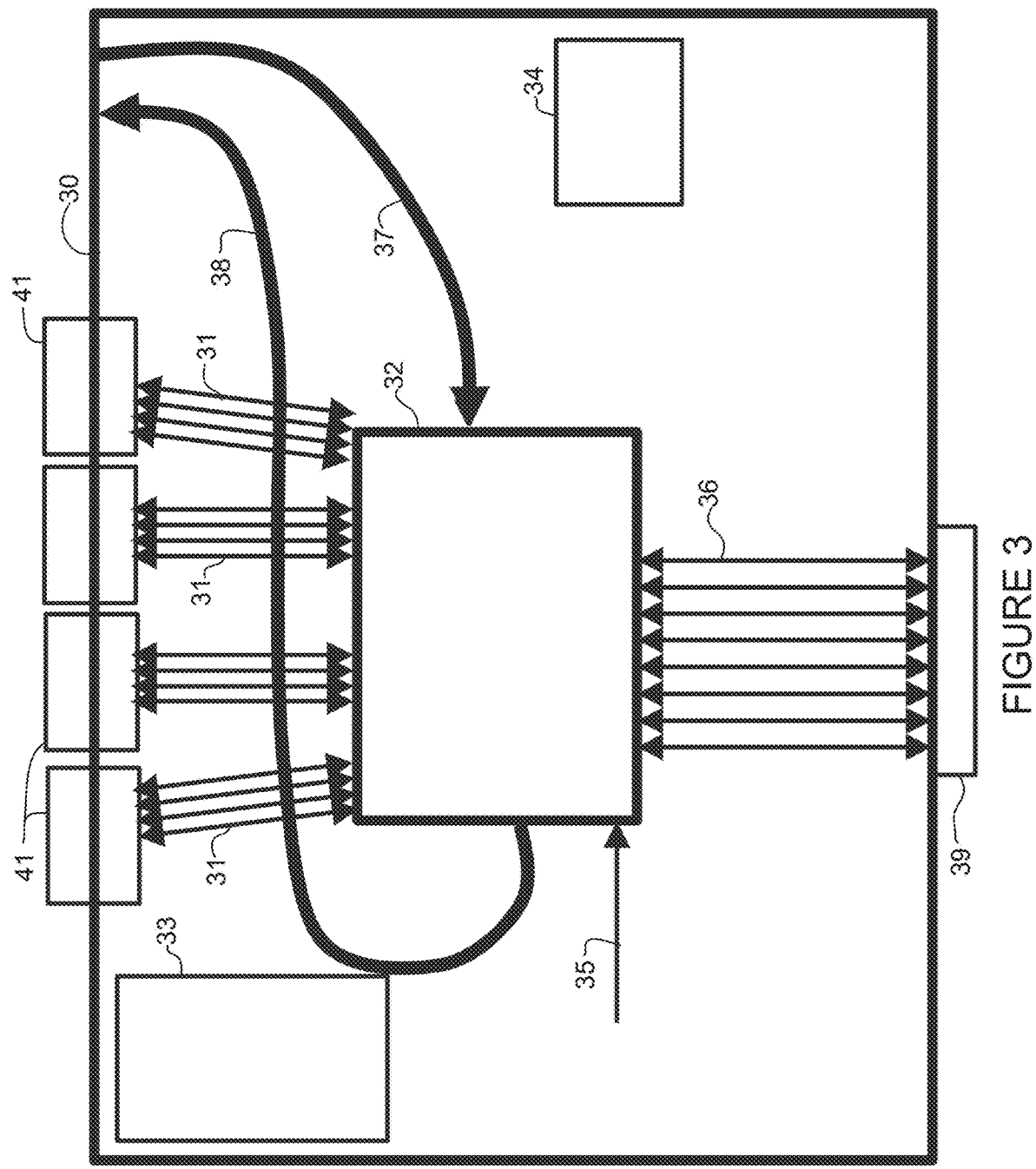
FIG. 3 illustrates the immersion cooling enclosure of FIG. 1 coupled with midplane connectors.

Referring first to FIG. 3, one example of an immersion cooling enclosure 32 is shown on a line card 30, in accordance with one embodiment. The simplified diagram shows a PSU 33 and CPU 34 mounted on the line card 30 for direct air-cooling, as previously described with respect to FIG. 1. In the example shown in FIG. 3, the immersion cooling enclosure 32 includes an electrical connection for power, management, control, or any combination thereof, at line 35, and a high-speed interconnect for coupling high speed connections 36 with connector (or connectors) 39. As previously noted, the dense high-speed interconnects 36 may be optical or electrical via PCB traces or high-speed cables. In this example, the immersion cooling enclosure 32 also includes midplane connections for connecting lines 31 with midplane connectors 41. The midplane connectors 41 may be positioned, for example, along a rear of the line card 30 and the dense high-speed connectors 39 positioned along a front face (faceplate) of the line card 30. Cool liquid is received at ingress line 37 and warm liquid flows out of the enclosure 32 at egress line 38.

Figure 4:
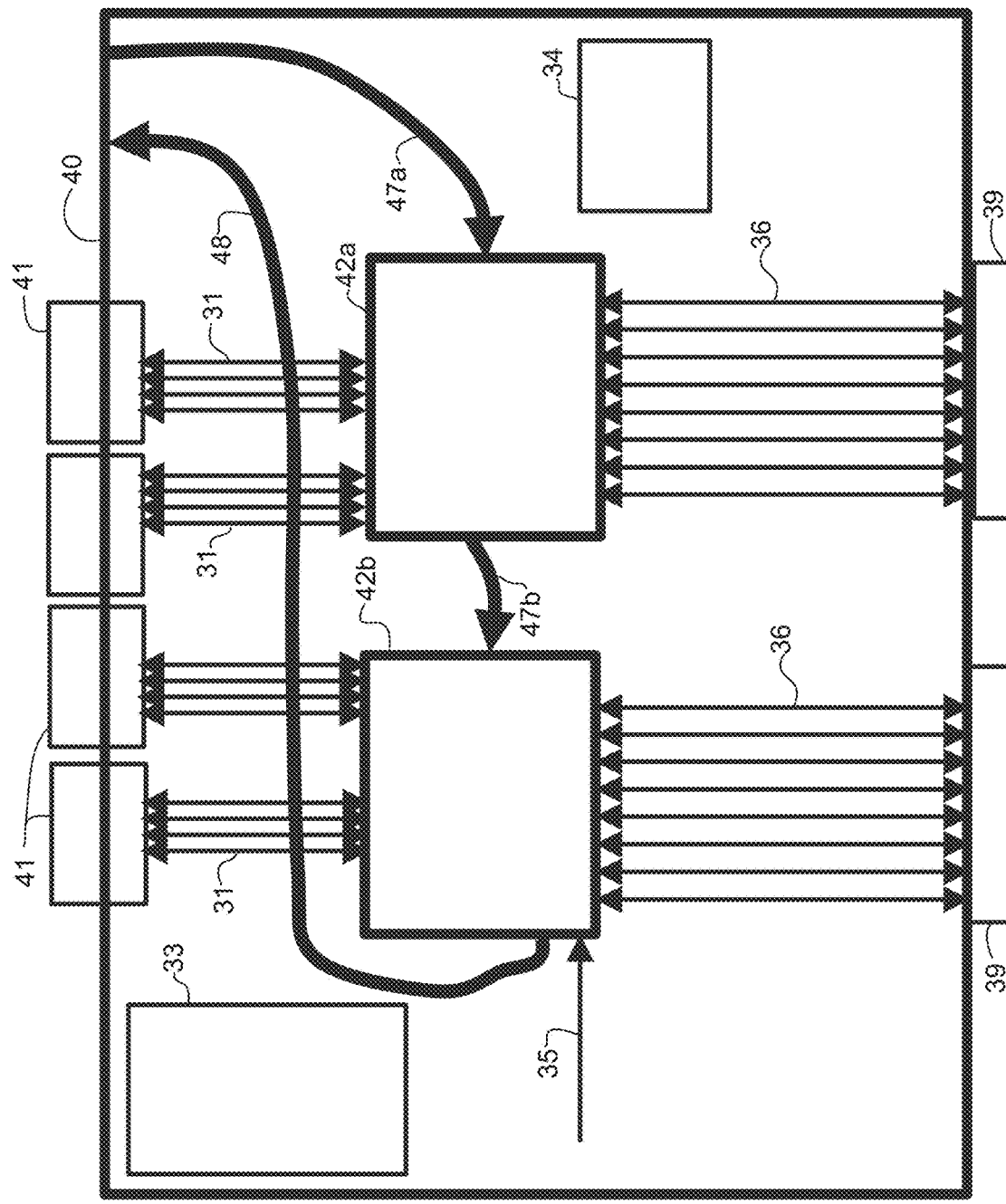
FIG. 4 illustrates multiple immersion cooling enclosures mounted on the line card of FIG. 3.

In one or more embodiments, a line card 40 comprises a plurality of enclosures 42a, 42b mounted on a printed circuit board, each of the enclosures comprising a plurality of electronic components, an electrical connector, fluid inlet connector, and a fluid outlet connector, as shown in FIG. 4. Two immersion cooling enclosures (first enclosure 42a, second enclosure 42b) are shown in FIG. 4, however, more than two enclosures may be mounted on the line card 40. A series cooling liquid circuit is shown in FIG. 4, in which cool liquid flows into the first immersion cooling enclosure 42a at line 47a, warm liquid flows out of the immersion cooling enclosure 42a at line 47b and into the second immersion cooling enclosure 42b. Warmer liquid flows out of the second immersion cooling enclosure 42b at line 48. In another example, the cooling liquid circuit may be in parallel, with two cool liquid lines entering each immersion cooling enclosure independently and two warm liquid cooling lines transferring liquid out of each of the enclosures, as described below with respect to FIG. 6.

Figure 5:
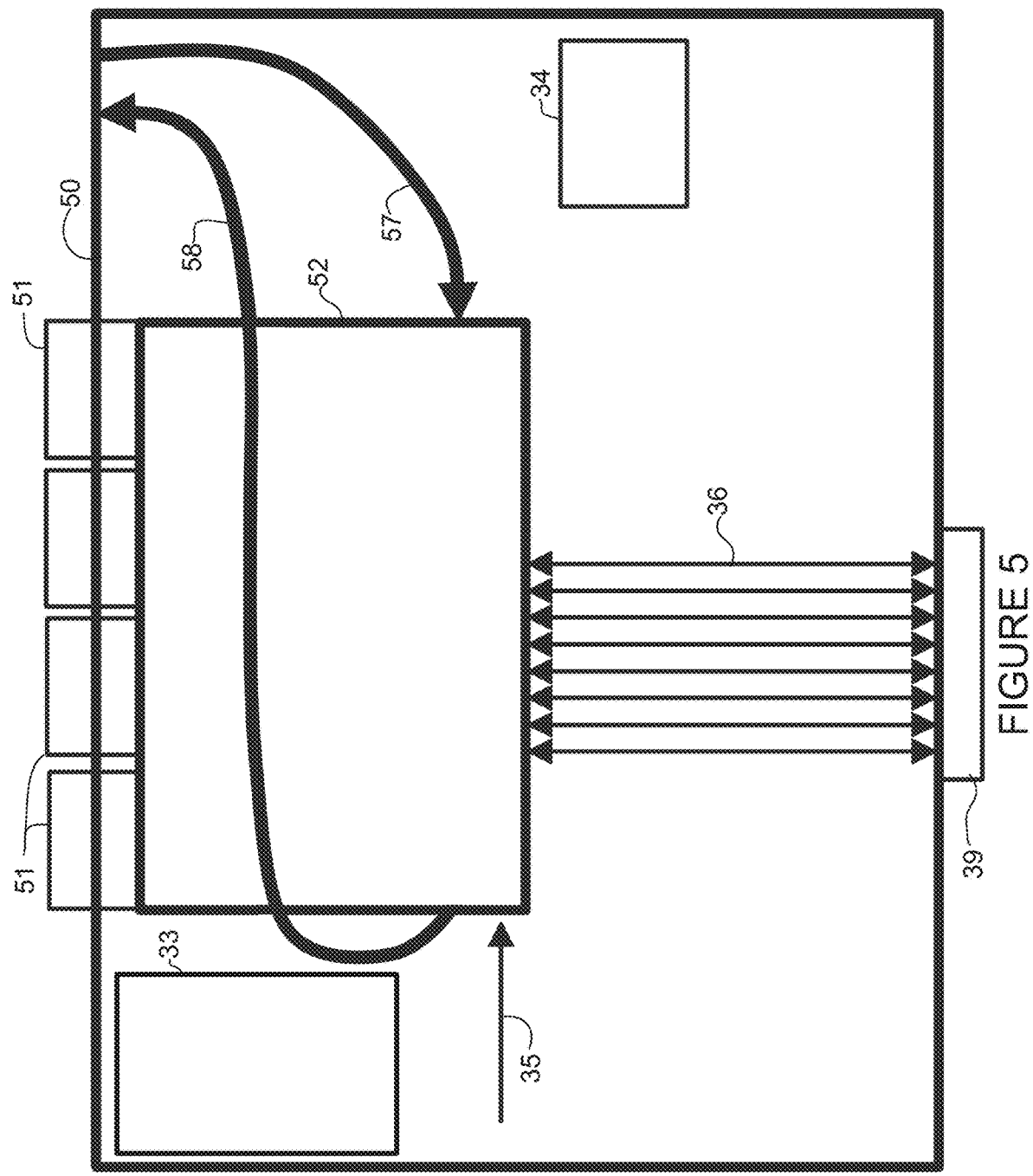
FIG. 5 illustrates the immersion cooling enclosure with integrated midplane connectors.

FIG. 5 illustrates an example of a line card 50 with a single immersion cooling enclosure 52 with integrated orthogonal midplane connectors 51, in accordance with one embodiment. The immersion cooling enclosure 52 includes an interface for the high-speed interconnects 36 and electrical connection 35 for power, management, and control. Coolant enters the immersion cooling enclosure at line 57 and warm coolant exits at line 58.

Figure 6:
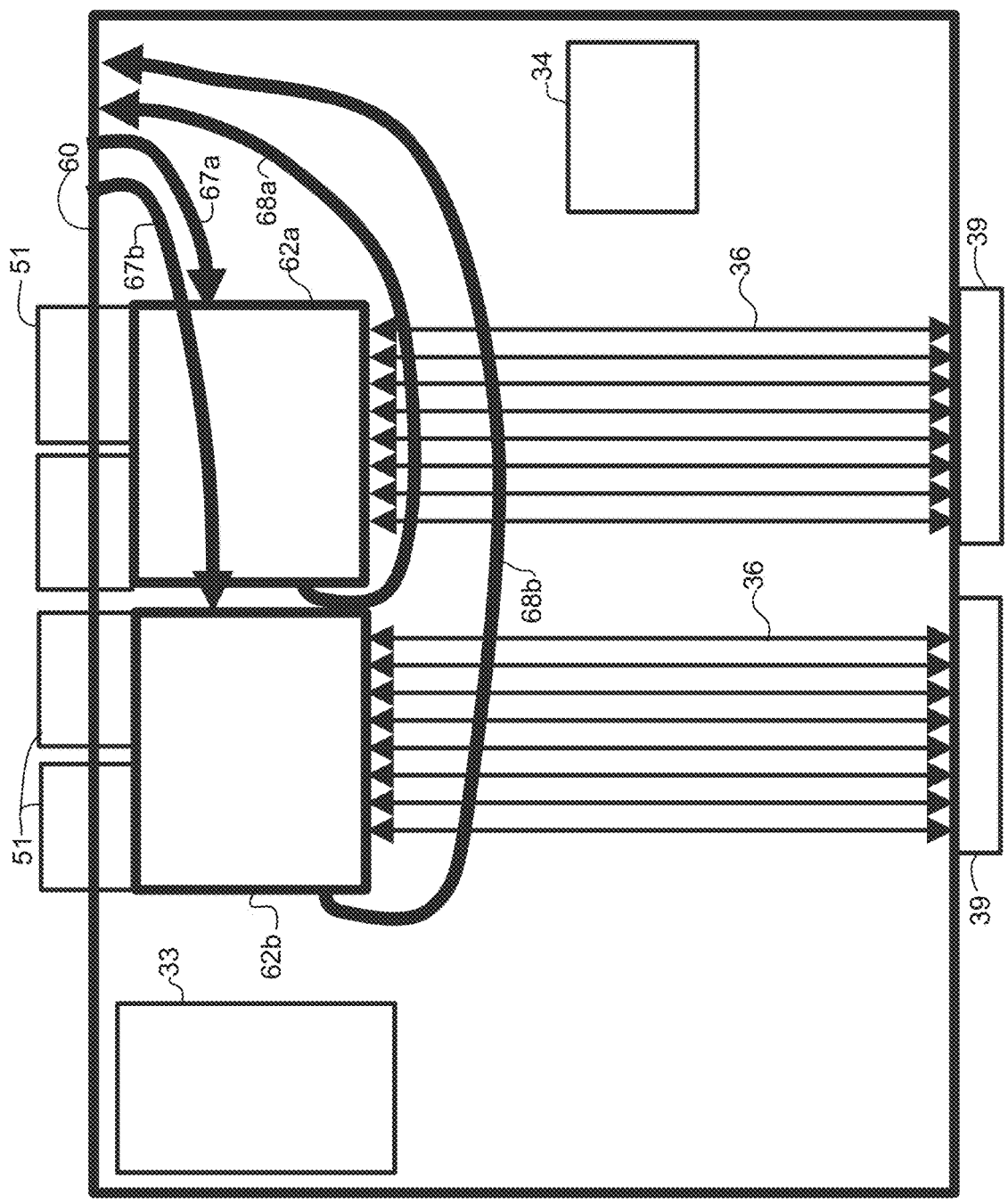
FIG. 6 illustrates multiple immersion cooling enclosures with integrated midplane connectors.

FIG. 6 illustrates an example of a line card 60 with two immersion cooling enclosures 62a, 62b, each configured with integrated midplane connectors 51. In this example, parallel cooling is used with cool fluid entering the enclosures 62a, 62b at lines 67a, 67b, and warm liquid exiting the enclosures at lines 68a, 68b, respectively.

Figure 7:
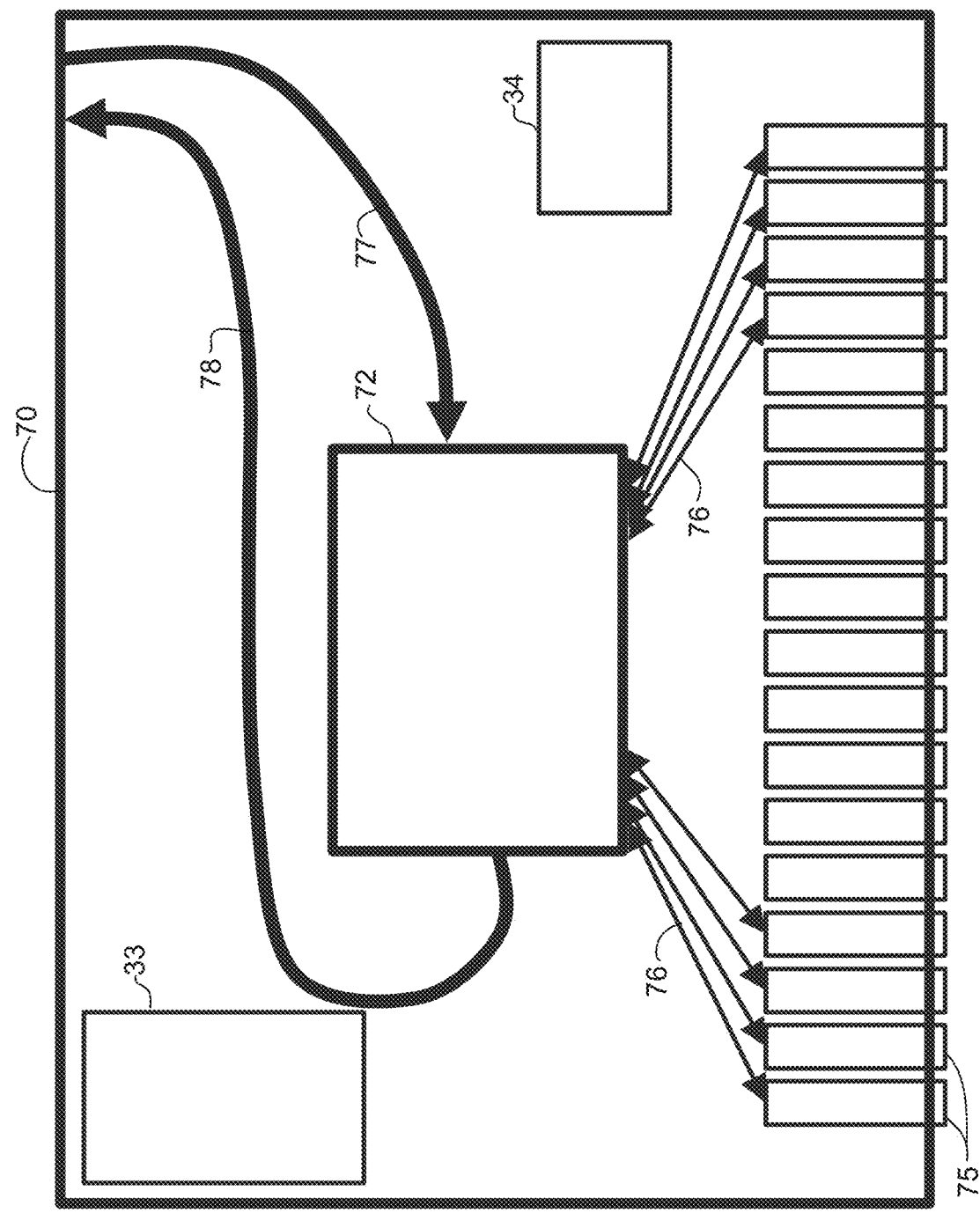
FIG. 7 illustrates the immersion cooling enclosure coupled to pluggable optical modules.

Referring now to FIG. 7, a line card 70 with immersion cooling enclosure 72 and pluggable optics (optical modules, optical transceivers) 75 is shown, in accordance with one embodiment. The pluggable optics 75 are cooled by forced air (e.g., air-cooling from fan), which may be implemented with a simplified design since other high-power components are cooled by liquid immersion cooling through liquid cooling at enclosure 72 via lines 77 and 78. The pluggable optics 75 are coupled to the enclosure 72 at lines 76. For simplification only some of the connections are shown.

Figure 8:
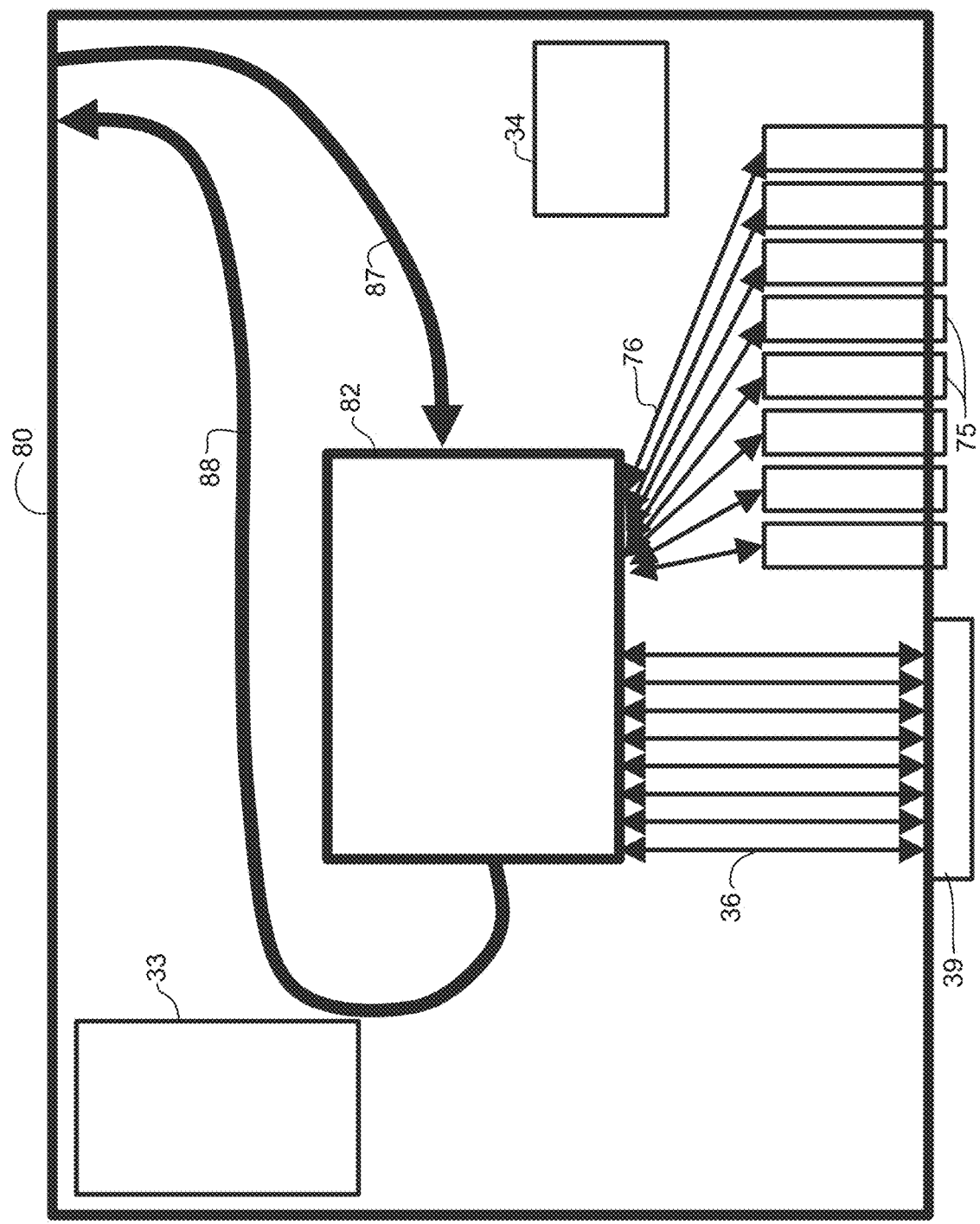
FIG. 8 illustrates the immersion cooling enclosure coupled to pluggable optical modules and high-speed connections.

In one or more embodiments, a line card 80 may comprise a mix of the pluggable optics 75 and co-packaged optics at immersion cooling enclosure 82, as shown in FIG. 8. Liquid immersion cooling for the co-packaged optics is provided at the enclosure 82 with liquid cooling circuit comprising ingress line 87 and egress line 88. The immersion cooling enclosure 82 is in communication with connectors 39 via one or more interconnects 36. This design enables support for pluggable high-power optics or copper cables. For example, the immersion cooling enclosure 82 allows co-packaged optics based NPU and optics to be efficiently cooled and provides a subset of the optical interfaces, but the remaining bandwidth capacity may be brought out of the immersion cooling enclosure via high-speed copper (e.g., PCB traces or high-speed cables) to pluggable module connectors to provide flexibility to insert any optics, including high-power coherent modules. The air-cooling capacity needed from the fans may be reduced, thereby lowering power requirements since there is a reduced thermal load that the fans need to cool.

Figure 9:
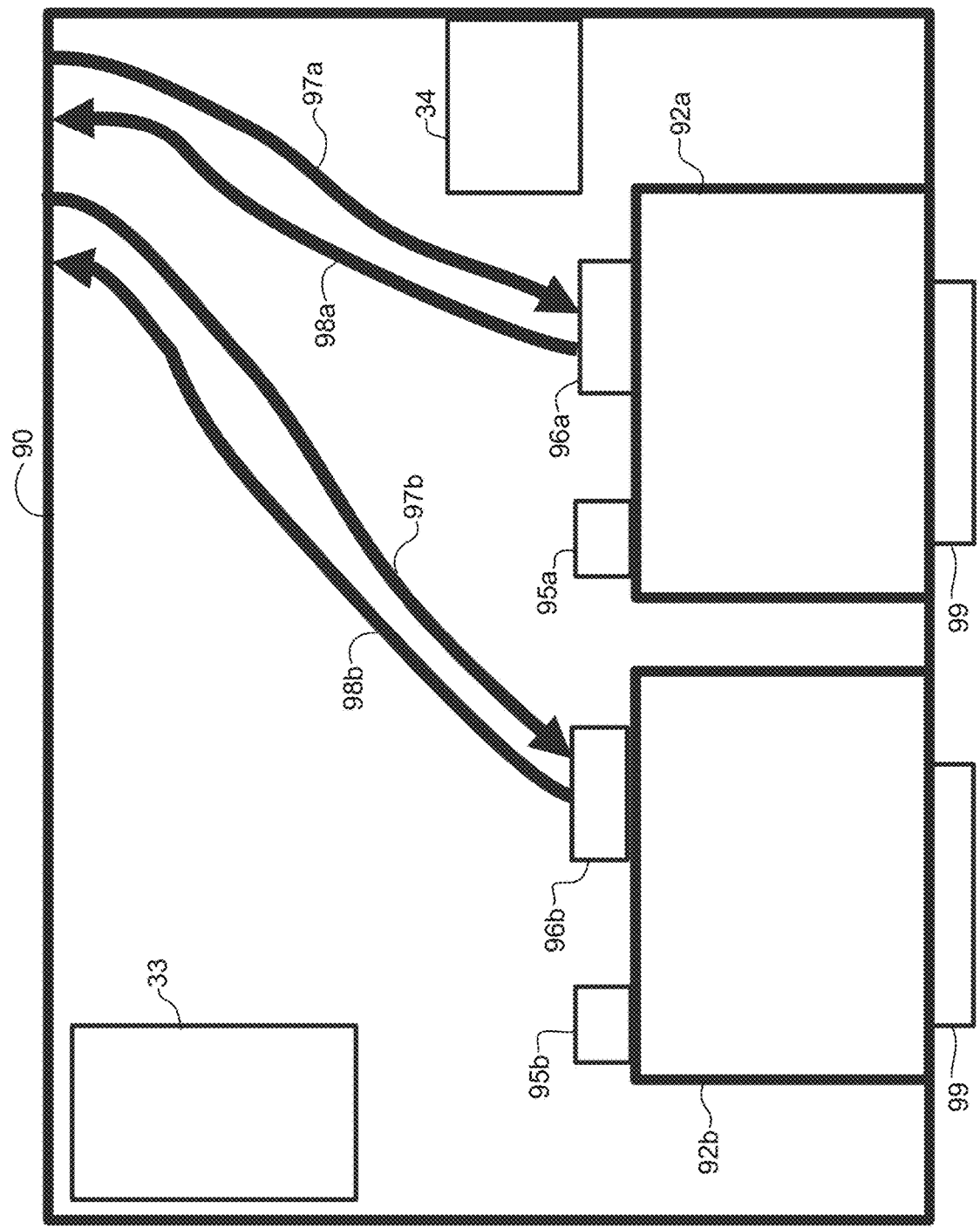
FIG. 9 illustrates pluggable immersion cooling enclosures.

FIG. 9 illustrates pluggable immersion cooling enclosures 92a, 92b mounted on line card 90, in accordance with one embodiment. In this example, front connections 99 may be provided for power, high-speed data, or optics. Blind-mate connections at connectors 95a, 95b may be provided for power, data (management and control), for example. Blind-mate liquid connectors 96a, 96b couple with ingress liquid lines 97a, 97b and egress fluid lines 98a, 98b, respectively. The immersion cooling enclosures 92a, 92b may include electronic or optical components with additional connections.

As previously noted, the layouts shown in FIGS. 1 and 3-9 are only examples and the immersion cooling enclosure technology described herein may be implemented in other layouts comprising any number of enclosures coupled to any number or type of connections with series or parallel liquid cooling circuits, and on any type or arrangement of line card without departing from the scope of the embodiments. For example, the immersion cooling enclosure may include multiple liquid ingress ports or egress ports. One or more of the immersion cooling enclosures may be a socketed enclosure with mating liquid connectors included in the attached structure.

FIGS. 10-12B illustrate examples of different component layouts and connectors for the immersion cooling enclosure. It is to be understood that these are only examples and the immersion cooling enclosure may be configured for cooling any number or type of components with any suitable connections.

Figure 10:
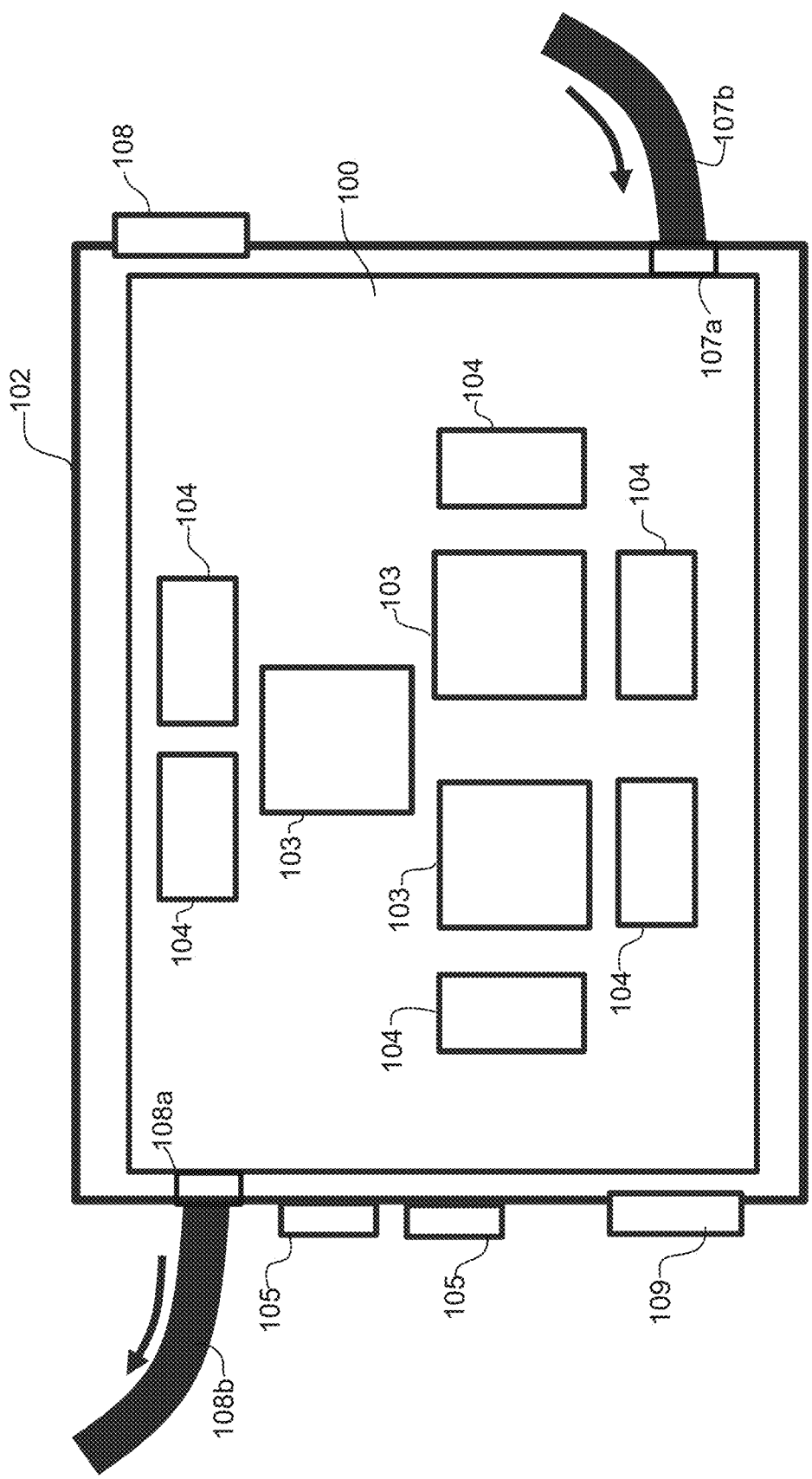
FIG. 10 illustrates another example of components within the immersion cooling enclosure.

Referring first to FIG. 10, an immersion cooling enclosure 102 is shown in accordance with one embodiment. Multiple high-power electronic integrated circuits (e.g., ASICs) are included within the enclosure 102 and mounted on a substrate 100. In the example shown in FIG. 10, the immersion cooling enclosure 102 comprises a plurality of NPUs 103 and SerDes 104. In this example, the immersion cooling enclosure 102 includes two dense high-speed data connectors 105, power connector 108, and low-speed data (management and control) connector 109. Fluid connectors 107a, 108a are coupled to ingress coolant line 107b and egress coolant line 108b, respectively.

FIGS. 11A and 11B are side views of immersion cooling enclosures 112a and 112b, respectively. For simplification, only some of the connections are shown in the schematics of FIGS. 11A and 11B. The sealed enclosure 112a, 112b is defined by a housing comprising a first wall 111a for mounting on a PCB 113 of a line card and a plurality of external walls (sidewalls 111b, upper wall 111c) forming the housing with the first wall (FIG. 11A). One or more connectors 115, 121 may be located on one or more of the sidewalls 111b, the first wall (bottom face 111a), or both the bottom wall and sidewalls. It should be noted that the terms lower, upper, bottom, top, below, above, horizontal, vertical, and the like, which may be used herein are relative terms dependent upon the orientation of the line card or enclosure and should not be interpreted in a limiting manner. These terms describe points of reference and do not limit the embodiments to any particular orientation or configuration.

The sealed enclosure 112a, 112b is filled (or at least partially filled) with dielectric liquid 114. The dielectric liquid is of sufficient volume to submerge the components 103, 104, 116, 119, which dissipate varying amounts of heat to the liquid. The liquid is received at ingress line 117 and exits at egress line 118. The immersion cooling enclosure 112a of FIG. 11A contains the NPU 103, SerDes 104, a silicon photonics chip 116, and a power convertor 119. In the example shown in FIG. 11A, the silicon photonics chip 116 is coupled to dense optical connector 115 and the power converter 119 is coupled to the power connector 121. High voltage power may be provided with internal down conversion, for example. The SerDes 104 is coupled to a dense high speed electrical connector 122 in FIG. 11B. High-speed input/output may be in the form of optical connectors or high-speed copper cables (e.g., twinax) as described above.

In the example shown in FIG. 11B, external connections are made through a dense PCB connector 123a on a surface (lower or bottom surface 111a as viewed in FIG. 11B) of the immersion cooling enclosure 112b. The dense PCB connector 123a (electrical connector) may be directly coupled to the PCB 113 at mating PCB connector 123b and comprises surface PCB connections for one or more of power, high-speed electrical, or low-speed electrical (e.g., control and management). The connector 123a is sealingly engaged with the enclosure (housing) 112b. Electrical connectivity of power or management signal may be brought in through the sidewall connector 121 or through the PCB connector 123a. Connections between connectors 121, 123a and electronic components 103, 104 may be routed through traces in the substrate 110.

The PCB connector 123a may be manufactured into the enclosure 112b so that the sealed enclosure is easily mounted on the mating connector 123b on the PCB 113 as the enclosure is pressed down onto the line card during assembly. This allows for the immersion cooling enclosure to be manufactured independently from the line card and easily mounted on the line card. For example, the components 103, 104, 116, 119 shown in FIGS. 11A and 11B and associated connections to the sidewall connectors 115, 121, 122 and bottom surface PCB connector 123a may be formed within the housing so that the sealed enclosure can be provided as a module ready to mate with the electrical, data, optical, and fluid connections and mounted on the PCB, thus reducing manufacturing complexity since the immersion cooling enclosure is separately assembled. The line card manufacturing and assembly is thereby separated from the potentially more complex co-packaged optics manufacturing and assembly, thus allowing different manufacturing specialization to be used as needed.

Figure 12A:
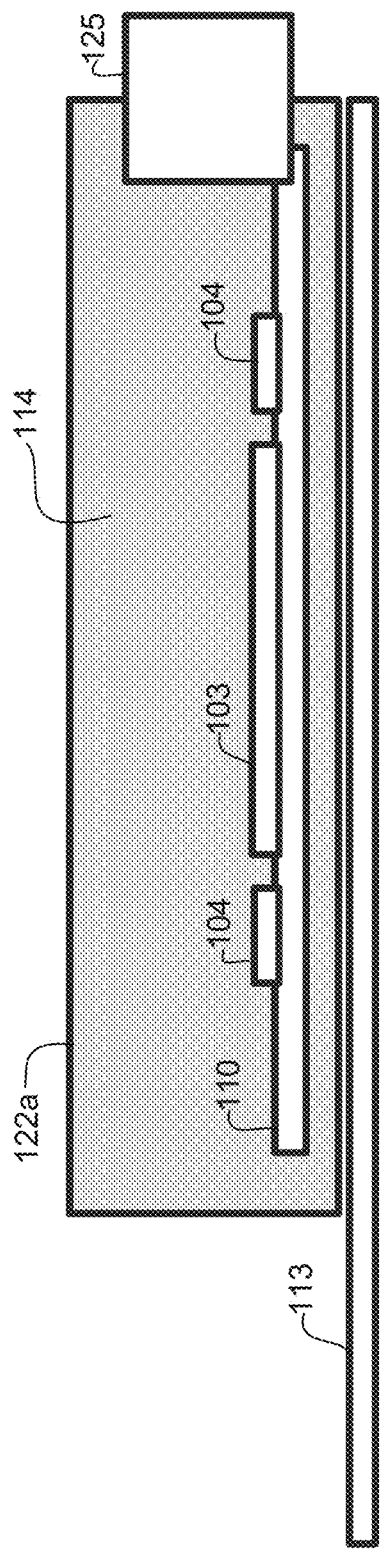
FIG. 12A is a side view of the immersion cooling enclosure with the integrated midplane connector.
Figure 12B:
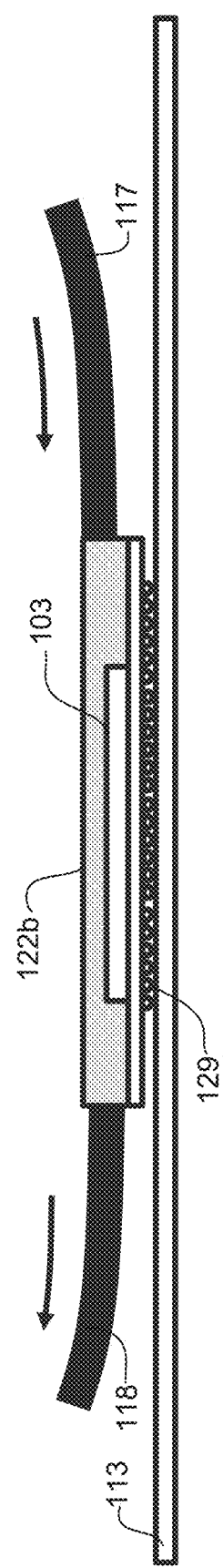
FIG. 12B is a side view of the immersion cooling enclosure with a BGA (Ball Grid Array) connection to the PCB.

FIGS. 12A and 12B illustrate direct attach connections to a midplane connector 125 and with a BGA (Ball Grid Array) 129, respectively. An immersion cooling enclosure 122a is shown in side view in FIG. 12A with the midplane connector 125.

FIG. 12B is a side view of an immersion cooling enclosure 122b with the BGA connection 129 to the PCB 113. Additional sidewall connectors or PCB connectors may be included on the immersion cooling enclosures 122a, 122b as described above with respect to FIGS. 11A and 11B.

It is to be understood that the connections shown in FIGS. 11A-12B are only examples and the immersion cooling enclosure may include one or more sidewall connectors, one or more PCB connectors, or both sidewall and PCB connectors. The immersion cooling enclosure may include, for example, one or more low-speed data connectors (e.g., control or management input/output), high-speed data connectors, power connectors, and fluid connectors.

Also, as previously noted, any number or type of components may be included in the immersion cooling enclosure. For example, the immersion cooling enclosure may include one or more electronic components including for example, CMOS (Complementary Metal-Oxide-Semiconductor) die, NPUs, SerDes chiplets, CDR (Clock-and-Data Recovery) circuit, DSP (Digital Signal Processing) chip, retimer chip, FPGA (Field-Programmable Gate Array), microprocessor, or any other chip, die, or circuit. The immersion cooling enclosure may also include one or more optical components, including for example, co-packaged or embedded optical engines, lasers, or light sources, or power components, including for example, power converter, power distribution device, or POL (Point-of-Load) device, or any other component or device. The immersion cooling enclosure may include, for example, multiple ASIC or NPU in one enclosure or any combination of ASIC/NPU, SerDes, optical engines, or other components. A die of the component may or may not be in contact with the dielectric fluid. For example, in one or more embodiments, a die package is in indirect contact with the fluid (via a conduction path through its lid) and in one or more embodiments the die is in direct contact with the fluid.

Furthermore, it is to be understood that the configurations described herein are only examples and any number, combination, or arrangement of connectors may be integrated into the immersion cooling enclosure. Connectivity to the immersion cooling enclosure may include, for example, one or more sidewall connectors (e.g., power, optical, high-speed data, low-speed data, fluid (inlet, outlet)), and circuit board connectors (e.g., dense bottom surface PCB connector) for power, high-speed electrical data, or low-speed electrical data. As previously noted, any number (e.g., one, two, three, or more) immersion cooling enclosures may be positioned on a line card in any arrangement.

Figure 13A:
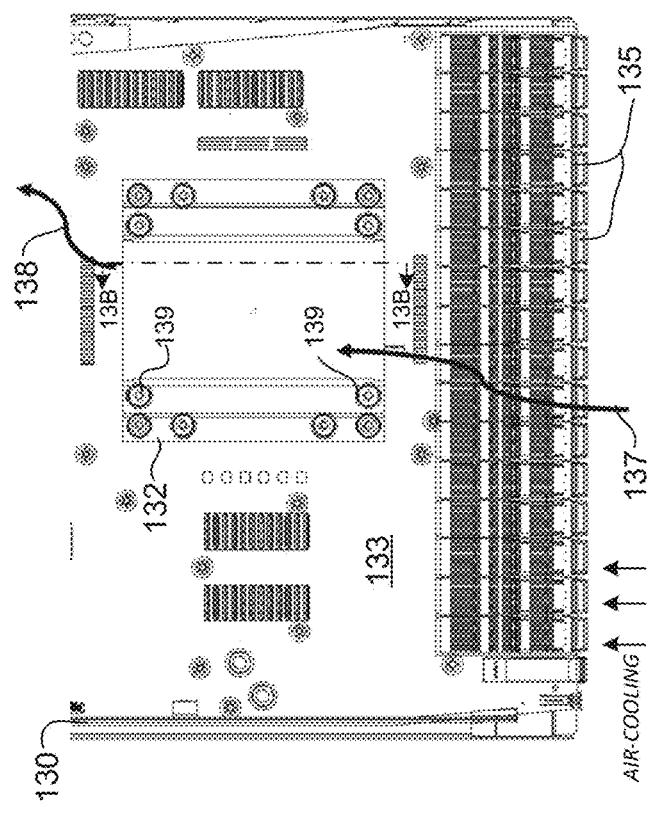
FIG. 13A is a top view of the immersion cooling enclosure mounted on a line card with pluggable optical modules.
Figure 13B:
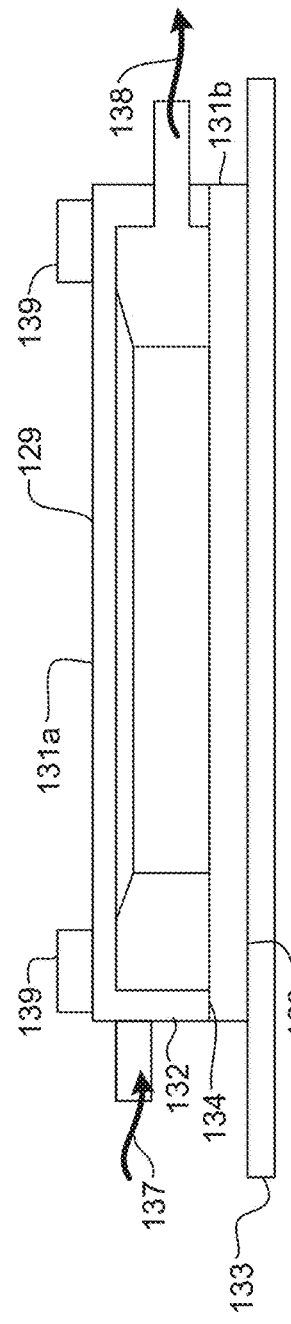
FIG. 13B is a cross-sectional view taken along line 13B-13B in FIG. 13A.

FIG. 13A is a top view of a module (line card) 130 comprising a plurality of pluggable optical modules 135 inserted into optical module cages mounted on the line card and an immersion cooling enclosure 132. The enclosure 132 may be mounted on the line card 130 with any number of spring loaded screws 139 (or other suitable fasteners). FIG. 13B is a cross-sectional view taken along line 13B-13B in FIG. 13A. A housing defines the sealed enclosure and comprises a first wall 128 for mounting on a PCB 133 of the line card and a plurality of external walls 129 (sidewalls, top wall) forming the housing with the first wall. As previously described, an electrical connector or optical connector may be positioned on one of the external walls 129. In this example, the immersion cooling enclosure 132 comprises an upper housing 131a and a lower housing 131b with a water-tight silicone seal, gasket, or other sealing mechanism provided at the interface of the lower and upper housings to define a fluid-tight compartment for the dielectric fluid. The housing is configured to surround and form a sealed enclosure about the electronic, optical, or electronic and optical components. The enclosure 132 may be mounted on the line card 130 with any number of spring loaded screws 139. For simplification, internal components and external connections other than fluid connections to fluid lines 137, 138, are not shown in FIG. 13B.

The fluidic coupling between the ingress and egress liquid cooling lines 137, 138 and the enclosure (housing) 132 may be established using suitable hoses, tubes, and connectors (e.g., quick disconnects). For example, quick disconnect couplings may be used to couple flexible tubes to the coolant inlet and outlet of the sealed housing to allow for ease of installation or removal of the immersion cooling enclosure from the line card. Sealed electrical and optical connectors may provide electrical, optical, or network connections to the components disposed within the immersion cooling enclosure.

Figure 14:
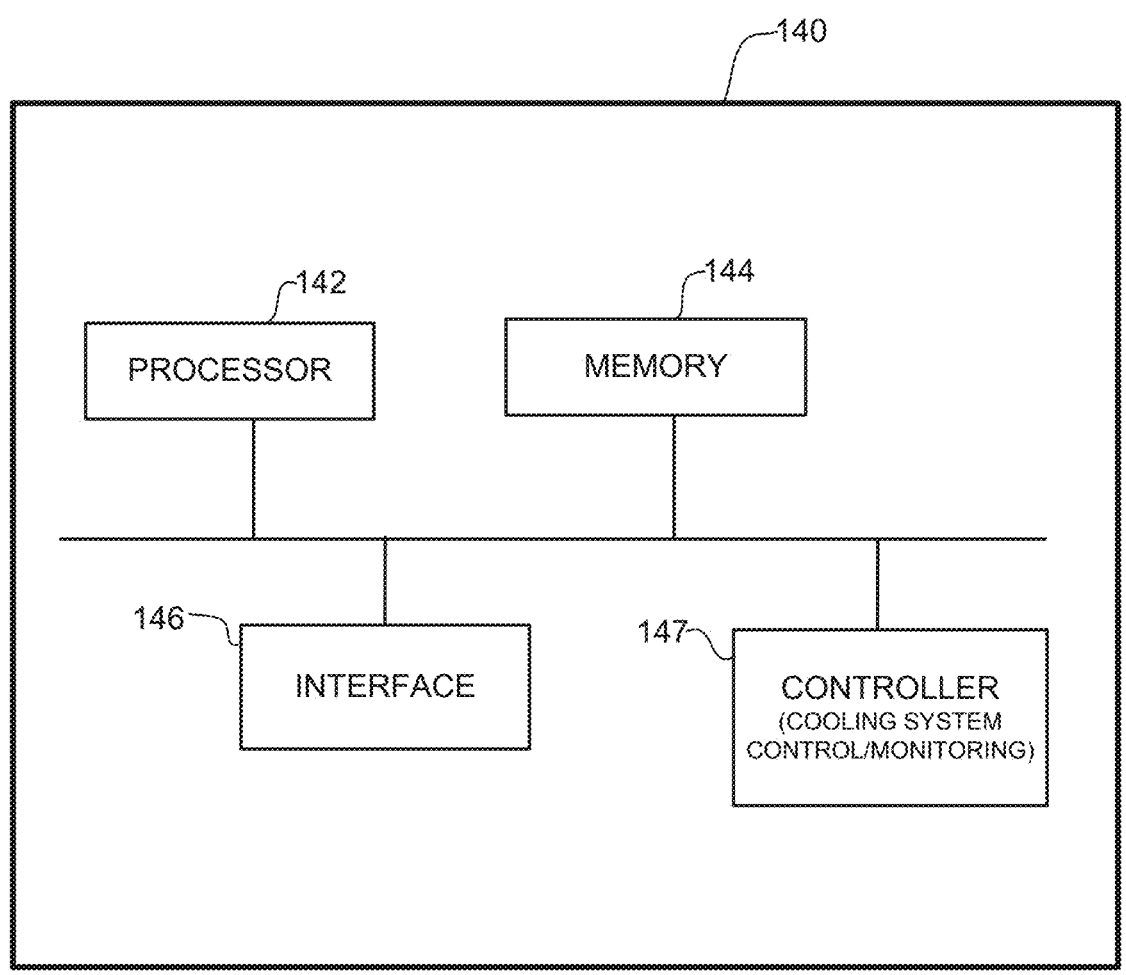
FIG. 14 is a block diagram of a network device in which embodiments described herein may be implemented.

As previously noted, the embodiments described herein may operate in the context of a network device. In one embodiment, a network device 140 is a programmable machine that may be implemented in hardware, software, or any combination thereof (FIG. 14). The network device 140 includes one or more processor 142, memory 144, and interfaces (power connections, data connections (electrical, optical)) 146, and controller 147 (cooling system control and monitoring). One or more of the components (e.g., processor, memory, interfaces (data, electrical, optical, cooling)) may be located on the line card.

Memory 144 may be a volatile memory or non-volatile storage, which stores various applications, operating systems, modules, and data for execution and use by the processor 142. The network device 140 may include any number of memory components.

Logic may be encoded in one or more tangible media for execution by the processor 142. For example, the processor 142 may execute codes stored in a computer-readable medium such as memory 144. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 140 may include any number of processors 142.

The controller 147 (e.g., logic, software, firmware, element, device) may be operable to monitor temperature, pressure, or flow at one or more locations within the network device and control cooling flow to one or more modules.

It is to be understood that the network device 140 shown in FIG. 14 and described above is only a simplified example and that the embodiments described herein may be implemented in different configurations of network devices. For example, the network device 140 may further include any suitable combination of hardware, software, algorithms, processors, devices, components, or elements.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus configured for insertion into a network device, the apparatus comprising:
    a printed circuit board comprising at least one first electrical connector;
    at least one electronic component mounted on the printed circuit board and configured for direct air-cooling; and
    an enclosure comprising a plurality of electronic components, a fluid inlet connector, and a fluid outlet connector, a substrate housed therein that supports at least one of the plurality of electronic components, at least one optical component, and an optical connector on an outer wall of the enclosure,
    wherein a second electrical connector provided on a bottom surface of the substrate is configured to connect to the at least one first electrical connector, and
    wherein a dielectric liquid is disposed within the enclosure for immersion cooling of said plurality of electronic components during operation of the network device.

2. The apparatus of claim 1, wherein the second electrical connector is a dense electrical connector.

3. The apparatus of claim 2, wherein the dense electrical connector and the enclosure define a sealed enclosure.

4. The apparatus of claim 1 wherein the optical connector comprises a plurality of optical fibers passing through the outer wall of the enclosure.

5. The apparatus of claim 1, wherein the at least one first electrical connector includes a mating connector for coupling with the second electrical connector.

6. The apparatus of claim 1, wherein the dielectric liquid comprises a warm dielectric fluid and a cool dielectric fluid which are supplied to the enclosure at the fluid inlet connector and wherein the warm dielectric fluid exits the enclosure at the fluid outlet connector in a low-pressure circuit.

7. The apparatus of claim 1, further comprising:
    a second enclosure mounted on the printed circuit board for the immersion cooling of at least one other electronic component of the plurality of electronic components.

8. The apparatus of claim 1, wherein at least one of the plurality of electronic components comprises a die in direct contact with the dielectric liquid in the enclosure.

9. The apparatus of claim 1, wherein the plurality of electronic components comprise a power component.

10. The apparatus of claim 1, wherein the second electrical connector is a power and data connector.

11. An apparatus configured for insertion into a network device, the apparatus comprising:
a printed circuit board;
at least one electronic component mounted on the printed circuit board and configured for direct air-cooling; and
an enclosure comprising a plurality of electronic components, an electrical connector, a fluid inlet connector, and a fluid outlet connector;
wherein a dielectric liquid is disposed within the enclosure for immersion cooling of said plurality of electronic components during operation of the network device, and
wherein the printed circuit board comprises a pluggable optical module configured for air-cooling and coupled to the enclosure.

12. The apparatus of claim 11, wherein the electrical connector includes a dense electrical connector or a midplane connector.

13. An apparatus comprising:
a sealed enclosure for connection to a line card;
a substrate within the sealed enclosure;
an electronic component mounted on the substrate;
an optical component mounted on the substrate;
an electrical connector for transmitting power or data to the electronic component within the sealed enclosure;
an optical connector for transmission of optical data to or from the optical component within the sealed enclosure;
a fluid inlet connector; and
a fluid outlet connector;
wherein a dielectric liquid is disposed within the sealed enclosure for immersion cooling of the electronic component and the optical component with the sealed enclosure connected to the line card.

14. The apparatus of claim 13, wherein the sealed enclosure is defined by a housing comprising a first wall for mounting on the line card and external walls forming the housing with said first wall.

15. The apparatus of claim 14 wherein the optical connector is located on one of the external walls.

16. The apparatus of claim 13 wherein the electrical connector comprises a power connector and a data connector.

17. The apparatus of claim 16 wherein at least one of the power connector and the data connector are located on a first wall for direct connection with a printed circuit board.

18. The apparatus of claim 16 wherein the data connector comprises a high-speed electrical connector and a low-speed electrical connector and the optical connector comprises a plurality of optical fibers.

19. A network device comprising:
a circuit board comprising at least one first electrical connector; and
a plurality of enclosures connected to the circuit board, each of the plurality of enclosures comprising a plurality of electronic components, a second electrical connector for connecting to the at least one first electrical connector, a fluid inlet connector, and a fluid outlet connector;
wherein a dielectric liquid is disposed within a respective enclosure of the plurality of enclosures, for immersion cooling of the plurality of electronic components with the fluid inlet connector and the fluid outlet connector coupled to a liquid cooling circuit,
wherein at least one of the plurality of enclosures comprises an enclosure sidewall connector that is connected to at least one of the plurality of electronic components or to a substrate within a respective enclosure, and
wherein the second electrical connector and the enclosure sidewall connector comprise a power connector and a high-speed data connector.

20. The network device of claim 19, wherein at least one of the plurality of enclosures comprises at least one optical component and an optical connector.

21. The network device of claim 19, wherein the fluid outlet connector of one of the plurality of enclosures is coupled to the fluid inlet connector at one of another one of the plurality of enclosures.

22. The network device of claim 19, wherein at least one of the plurality of enclosures houses a substrate therein that supports at least one of the plurality of electronic components and includes the second electrical connector on a bottom surface thereof.

23. An apparatus comprising:
a housing defining a sealed enclosure and comprising a first wall for mounting on a line card and external walls forming the housing with said first wall;
a substrate disposed within the housing;
an electronic component mounted on the substrate;
an electrical connector for transmitting power or data to the electronic component within the sealed enclosure;
an optical component coupled to the substrate;
an optical connector positioned on one of the external walls;
a fluid inlet connector; and
a fluid outlet connector;
wherein the sealed enclosure is configured for immersion cooling of the electronic component.

24. The apparatus of claim 23 further comprising a second electrical connector located on said first wall for direct connection with a printed circuit board.

25. The apparatus of claim 23, wherein the electrical connector is configured to couple the sealed enclosure to another electrical connector on the substrate.

26. The apparatus of claim 23, wherein the electrical connector, positioned on one of the external walls, is a midplane connector integrated with the sealed enclosure.

* * * * *

UNITED STATES PATENT AND TRADEMARK OFFICE
CERTIFICATE OF CORRECTION

| | |
|---|---|
| PATENT NO. | : 11,917,793 B2 |
| APPLICATION NO. | : 17/145816 |
| DATED | : February 27, 2024 |
| INVENTOR(S) | : Mark Nowell et al. |

It is certified that error appears in the above-identified patent and that said Letters Patent is hereby corrected as shown below:

In the Claims

Claim 4, Column 12, Line 51, please replace "The apparatus of claim 1 wherein the optical connector" with --The apparatus of claim 1, wherein the optical connector--

Signed and Sealed this
Second Day of July, 2024

Katherine Kelly Vidal
*Director of the United States Patent and Trademark Office*